(12) United States Patent
Akane et al.

(10) Patent No.: US 7,915,791 B2
(45) Date of Patent: Mar. 29, 2011

(54) QUARTZ CRYSTAL DEVICE ACCOMODATING CRYSTAL BLANKS OF MULTIPLE SHAPES AND SIZES

(75) Inventors: Katsunori Akane, Sayama (JP); Masakazu Harada, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 160 days.

(21) Appl. No.: 12/252,171

(22) Filed: Oct. 15, 2008

(65) Prior Publication Data

US 2009/0102322 A1    Apr. 23, 2009

(30) Foreign Application Priority Data

Oct. 18, 2007  (JP) .................................. 2007-271786
Oct. 25, 2007  (JP) .................................. 2007-277074

(51) Int. Cl.
*H01L 41/04* (2006.01)
*H01L 41/08* (2006.01)

(52) U.S. Cl. ......... 310/348; 310/344; 310/363; 310/365

(58) Field of Classification Search ................... 310/344, 310/348, 363, 365
See application file for complete search history.

(56) References Cited

U.S. PATENT DOCUMENTS

| | | | |
|---|---|---|---|
| 5,841,217 A * | 11/1998 | Kizaki et al. .................. | 310/348 |
| 6,229,249 B1 | 5/2001 | Hatanaka et al. | |
| 6,396,201 B1 * | 5/2002 | Ide et al. ........................ | 310/353 |
| 6,628,048 B2 * | 9/2003 | Moon et al. .................... | 310/348 |
| 7,095,161 B2 * | 8/2006 | Unno et al. .................... | 310/348 |
| 7,116,039 B2 * | 10/2006 | Arai et al. ...................... | 310/341 |
| 7,180,225 B2 * | 2/2007 | Sashida et al. ................. | 310/330 |
| 7,247,978 B2 * | 7/2007 | Robinson et al. ............. | 310/345 |
| 7,449,820 B2 * | 11/2008 | Moriya .......................... | 310/348 |
| 7,482,735 B2 * | 1/2009 | Harada et al. ................. | 310/348 |
| 2002/0036448 A1 | 3/2002 | Kageyama et al. | |

(Continued)

FOREIGN PATENT DOCUMENTS

JP    4-82314    3/1992

(Continued)

OTHER PUBLICATIONS

Masakazu Harada, et al., Research on Miniaturization of Low-Frequency Range SMD Crystal Unit, Frequency Control Symposium, 2007 Joint With 21st European Frequency and Time Forum IEEE International, IEEE, PI, May 1, 2007, pp. 150-153.

(Continued)

*Primary Examiner* — J. SanMartin
(74) *Attorney, Agent, or Firm* — Knobbe, Martens, Olson & Bear, LLP

(57) ABSTRACT

The quartz crystal device includes a container body having: a recess; a pair of holding terminals formed on an inner bottom surface of the recess; and a crystal blank, both principal surfaces of which are provided with excitation electrodes with lead-out electrodes extending from the pair of excitation electrodes toward both sides of one end of the crystal blank. Both sides of one end of the crystal blank are fixed to the holding terminals using a conductive adhesive. Pillow members are provided on the inner bottom surface of the recess at positions corresponding to corners on both sides of the other end of the crystal blank, and the two pillow members are independent of each other. Alternatively, each holding terminal includes a first region formed near the facing holding terminal and a second region having a greater thickness than the first region formed far from the facing holding terminal.

14 Claims, 5 Drawing Sheets

U.S. PATENT DOCUMENTS

| | | |
|---|---|---|
| 2004/0085003 A1 | 5/2004 | Miura |
| 2004/0095044 A1 | 5/2004 | Yagishita |
| 2005/0040735 A1 | 2/2005 | Okajima |
| 2007/0145863 A1* | 6/2007 | Kusai .......................... 310/348 |

FOREIGN PATENT DOCUMENTS

| | | |
|---|---|---|
| JP | 6-152311 | 5/1994 |
| JP | 8-316769 | 11/1996 |
| JP | 2001-237665 | 8/2001 |
| JP | 2002-33579 A | 1/2002 |
| JP | 2002-111435 A | 4/2002 |
| JP | 2002-261568 A | 9/2002 |
| JP | 2003-32068 | 1/2003 |
| JP | 2004-266595 A | 9/2004 |
| JP | 2004-357131 A | 12/2004 |
| JP | 2005-198237 A | 7/2005 |
| JP | 2006-295700 A | 10/2006 |
| WO | 2005/109638 A1 | 11/2005 |

OTHER PUBLICATIONS

European Search Report issued by European Patent Office on May 4, 2010 for the counterpart European Patent Application No. 10154563.0.

Office Action issued by the Japanese Patent Office on Jan. 29, 2010, for the Japanese counterpart Patent Application No. 2007-271786.

Office Action issued by the Japanese Patent Office on Feb. 1, 2010 for the counterpart Japanese Patent Application No. 2007-277074.

Office Action issued by the Japanese Patent Office on Jun. 6, 2010 for the counterpart Japanese Patent Application No. 2007-271786.

* cited by examiner

QUARTZ CRYSTAL DEVICE ACCOMODATING CRYSTAL BLANKS OF MULTIPLE SHAPES AND SIZES

BACKGROUND OF THE INVENTION

1. Field of the Invention

The present invention relates to a quartz crystal device having a configuration in which a quartz crystal blank is hermetically sealed in a container, and more particularly, to a quartz crystal device for surface mounting capable of normally operating even when the device receives a mechanical shock and maintaining a good vibration characteristic thereof.

2. Description of the Related Arts

Quartz crystal units having a quartz crystal blank hermetically sealed in a container, and quartz crystal oscillators, in which such a crystal unit and an IC (integrated circuit) chip having a circuit using the crystal unit are integrated, are generically called "quartz crystal devices." The quartz crystal devices are used for a variety of electronic devices. For example, surface-mount crystal units having a crystal blank hermetically encapsulated in a container are small and light, and are therefore incorporated together with an oscillation circuit in portable electronic devices represented by cellular phones as frequency and time reference sources.

In recent years, these quartz crystal devices are increasingly made more compact. In the case of a surface-mount crystal unit, standardization whereby the planar outer dimensions of a container are defined as 5×3.2 mm or 3.2×2.5 mm is underway and various types of crystal blanks are accommodated in these containers according to their applications and functions. Moreover, crystal units having much smaller dimensions than these standardized dimensions are also put to practical use. Such downsized quartz crystal devices are required to maintain their vibration characteristics when a mechanical shock is applied thereto and prevent frequency variations in particular.

FIG. 1A is a cross-sectional view showing an example of configuration of a conventional surface-mount crystal unit, and FIG. 1B is a plan view of the crystal unit shown in FIG. 1A with the cover removed.

The illustrated surface-mount crystal unit is made up of crystal blank 2 accommodated in container body 1 for surface mounting, covered with metal cover 5 and hermetically sealed in the container. Container body 1 is made of, for example, laminated ceramics and has a substantially rectangular outside shape, that is, a substantially flat rectangular parallelepiped shape having a rectangular top view when this crystal unit is mounted on a wiring board. A recess is formed in the top surface of container body 1 to accommodate crystal blank 2. A pair of holding terminals 3 are provided on an inner bottom surface of the recess near both ends of one side of the inner bottom surface. Holding terminals 3 are used to electrically and mechanically holding crystal blank 2 in the recess. Metal cover 5 is bonded to the top surface of container body 1 by means of seam welding to close the recess thereby hermetically sealing crystal blank 2 in the recess.

Container body 1 is provided with outside terminals 4 in the four corners of the outer bottom surface of container body 1, that is, the surface facing a wiring board when mounted on the wiring board. Outside terminals 4 are used to surface-mount container body 1 on the wiring board. Each outside terminal 4 is formed as a substantially rectangular conductive layer. Of these four outside terminals 4, a pair of outside terminals 4 located at both ends of one diagonal on the outer bottom surface of container body 1 are electrically connected to a pair of holding terminals 3 via a conductive path formed in the lamination plane between the ceramic layers of container body 1. Furthermore, remaining two outside terminals 4 are used as grounding terminals. Outside terminals 4 used as the grounding terminals are electrically connected to metal cover 5 via a conductive path (not shown) formed in container body 1.

Crystal blank 2 is made up of, for example, a substantially rectangular AT-cut quartz crystal blank as shown in FIG. 2. Excitation electrodes 6a are formed on both principal surfaces of crystal blank 2. The positions where excitation electrodes 6a are formed constitute vibration regions of crystal blank 2. Lead-out electrodes 6b extend from the pair of excitation electrodes 6a toward both sides of one end of crystal blank 2. At the position of the end of crystal blank 2, lead-out electrodes 6b are formed so as to fold back between both principal surfaces of crystal blank 2. Crystal blank 2 is fixed in the recess of container body 1 by securing these lead-out electrodes 6b to holding terminals 3 at the positions where the pair of lead-out electrodes 6b are led out using, for example, conductive adhesive 7 or the like and electrically and mechanically connected to container body 1.

Conductive adhesive 7 is, for example, of a thermosetting type and coated on holding terminals 3 as a primer coat beforehand. When crystal blank 2 is fixed, both sides of one end of crystal blank 2 are placed on conductive adhesive 7 and conductive adhesive 7 is then heat set. Alternatively, it is also possible to apply the conductive adhesive onto holding terminals 3 as a primer coat, place both sides of one end of crystal blank 2 on conductive adhesive 7, further apply conductive adhesive 7 on the top surface on both sides of one end of crystal blank 2 as a topcoat and then heat-set conductive adhesive 7.

As is well known, the AT-cut crystal blank operates in a thickness-shear vibration mode and has a vibration frequency inversely proportional to the thickness thereof. Examples of the cross-sectional shape along the longitudinal direction of crystal blank 2 include a bevel shape, convex shape and flat shape. As shown in FIG. 3A, a bevel-shaped crystal blank has a thickness which is constant over a certain range of breadth of the central part and decreasing from the central part toward the periphery. As shown in FIG. 3B, a convex-shaped crystal blank has a gently varying thickness which becomes a maximum at the center of the crystal blank. As shown in FIG. 3C, a flat-shaped crystal blank has a constant thickness over the entire range. When the vibration frequency is approximately 30 MHz or more, crystal blank 2 is formed into a flat shape. On the other hand, when the vibration frequency is lower than 30 MHz, crystal blank 2 is formed into a bevel shape or convex shape through edge dressing to confine the vibration energy within the central region of crystal blank 2 and reduce crystal impedance (CI) of crystal blank 2.

Of both ends in the longitudinal direction of crystal blank 2, one end which is fixed to container body 1 by conductive adhesive 7 is called a "fixed end" and the other end is called a "free end." Pillow member 8 protruding from the inner bottom surface of container body 1 is provided on the inner bottom surface of container body 1 at a position corresponding to the free end of crystal blank 2. The free end of crystal blank 2 is placed on pillow member 8 without being fixed to pillow member 8. The free end may also be placed above pillow member 8 so as not to contact pillow member 8. Provision of the pillow member is disclosed, for example, in Japanese Patent Laid-Open Application No. 2001-237665 (JP-A-2001-237665) and Japanese Patent Laid-Open Application No. 2003-32068 (JP-A-2003-032068). When the cross-sectional shape in the longitudinal direction of crystal blank 2 is assumed to be a bevel shape or convex shape as described above, pillow member 8 is intended to prevent the vibration region in which particularly excitation electrode 6a of crystal blank 2 is formed from contacting the inner bottom surface of container body 1. Also in the case where the cross-sectional shape of crystal blank 2 is a flat shape, the vibration region of crystal blank 2 may contact the inner bottom surface of container body 1 due to warpage or the like of container body 1, and therefore pillow member 8 is effective in such a case, too.

Such pillow member 8 is provided simultaneously with a tungsten (W) layer or molybdenum (Mo) layer formed as an underlying electrode layer making up holding terminals 3 using a printing method when ceramic green sheets are laminated and burned to form container body 1. Alternatively, pillow member 8 may be made of ceramics, and integrally burned and formed with container body 1.

Pillow member 8 reduces the swinging range of the free end of crystal blank 2 when a mechanical shock is applied to the quartz crystal device and maintains the vibration characteristic of crystal blank 2 satisfactorily. Upon receiving a shock, crystal blank 2 swings around the fixed end as the axis, but the provision of pillow member 8 reduces the swinging range at the free end, and therefore the degree of swinging of crystal blank 2 also decreases and influences on conductive adhesive 7 which holds the crystal blank at the fixed end also decrease. The vibration system of crystal blank 2 including conductive adhesive 7 has less variation by shock, and can thereby maintain the vibration characteristic satisfactorily.

On the other hand, when pillow member 8 is not provided, the swinging range on the free end side of crystal blank 2 increases when a shock is applied, the influence of the swinging also extends to conductive adhesive 7, causes a variation in the state thereof, that is, the influence reaches the vibration system and deteriorates the vibration characteristic of the crystal blank. In this way, pillow member 8 provided for the free end of crystal blank 2 is meaningful in two aspects: preventing the vibration region of crystal blank 2 from contacting the inner bottom surface of container body 1; and maintaining the vibration characteristic of the vibration system against shocks.

As described above, since the thickness of crystal blank 2 is inversely proportional to the vibration frequency, the higher the vibration frequency, the smaller the thickness of crystal blank 2 becomes and the planar outside size of crystal blank 2 also reduces accordingly. On the contrary, the lower the vibration frequency, the greater the thickness of crystal blank 2 becomes and the planar outside size increases. In the case of volume production of crystal blanks, edge dressing by which the shape in the longitudinal direction of the crystal blank is formed into a bevel shape or convex shape is performed by generally putting many crystal blanks into a cylindrical or spherical hollow recipient together with abrasives and rotating the hollow recipient. As the hollow recipient rotates, the perimeter of crystal blank 2 is worked into a curved surface along the inner perimeter of the hollow recipient. Through such work, an inclined surface having a curved surface is formed on the crystal blank not only in the longitudinal direction but also in a direction parallel to the short side of crystal blank 2.

In this way, when the cross section in the short side direction of crystal blank 2 is thick in the central part and thin at both ends, it is necessary to make holding terminals 3 thicker and increase the height of holding terminals 3 from the inner bottom surface to prevent crystal blank 2 from contacting the inner bottom surface of container body 1. Therefore, two coats of the underlying electrode layer made of tungsten, molybdenum or the like are given to holding terminals 3 by printing as shown in FIG. 4. Of the underlying electrode layer, a layer directly contacting the inner bottom surface of container body 1, that is, a bottom layer is assumed to be first layer 3a and a layer formed on first layer 3a is assumed to be second layer 3b. In this way, the underlying electrode layer formed using the printing method is integrally burned and formed with container body 1, then nickel (Ni) and gold (Au) plating is applied to the surface of the underlying electrode layer. Since holding terminals 3 are formed by printing, the area of a higher layer is reduced by an amount corresponding to the width of the opening of a mask used for printing. First layer 3a not only functions as holding terminals 3 but also is used for a circuit pattern to connect holding terminals 3 and outside terminals 4, and therefore the thickness of first layer 3a is reduced and the thickness of second layer 3b is increased.

When both sides of one end of crystal blank 2 are secured to holding terminals 3, this prevents the central part in the short side direction of the crystal blank having a relatively large thickness from contacting the inner bottom surface of container body 1.

The width, that is, length in the short side direction, of the crystal blank is made to change for each vibration frequency band of the crystal blank to avoid spurious vibration according to the width. Therefore, the length of each holding terminal 3 along the short side direction of the crystal blank is increased to support various types of crystal blank 2 of different vibration frequency bands using the same container body 1. This allows various types of crystal blank 2 in different planar outside sizes, especially different width dimensions to be connected to a pair of holding terminals 3 while standardizing container body 1, and improves productivity.

However, the above described conventional surface-mount crystal unit has a problem that as the miniaturization advances, the vibration frequency changes when a shock is applied.

When the planar outside size of crystal blank 2 reduces as the miniaturization of the crystal unit advances, the vibration characteristic, especially the crystal impedance (CI) deteriorates if no modification is made, and therefore the area of excitation electrode 6a is generally increased. When, for example, the planar outside size of crystal blank 2 is assumed to be 2.1×1.45 mm, excitation electrode 6a is formed by using vapor deposition or a sputtering method on substantially the entire surface of each principal surface of crystal blank 2 except a portion of 0.1 to 0.15 mm corresponding to the frame width of the mask. However, since holding by conductive adhesive 7 is taken into consideration at the position where lead-out electrode 6b is led out, excitation electrode 6a is not formed to the limit of the perimeter of the crystal blank. Therefore, excitation electrode 6a is formed on the three sides of substantially rectangular crystal blank 2 except the electrode-free portion of 0.1 to 0.15 mm from the outer edge. As a result, the outer dimension of excitation electrode 6a becomes on the order of 1.6×1.2 mm and the area thereof becomes approximately 63% of the area of crystal blank 2. When excitation electrode 6a is formed so as to cover most part of the principal surface of crystal blank 2 in this way, if the free end of crystal blank 2 contacts pillow member 8 due to a shock, not only the electrode-free portion at the tip of the free end but also excitation electrode 6a contacts pillow member 8. When the present inventors observed excitation electrode 6a of a portion which seemed to have contacted pillow member 8, damage was found in excitation electrode 6a of that portion. The present inventors guessed that this damage would be the cause for the vibration frequency variation.

Moreover, though in the above described surface-mount crystal unit, container body 1 is standardized for various types of crystal blank 2 having different widths, when a shock is applied, crystal blank 2 is liable to peel off holding terminals 3. That is, the above described crystal unit has an insufficient anti-shock characteristic. Especially, the crystal blank subjected to edge dressing that forms its cross section into a bevel shape or convex shape has a tendency to have a small fixing strength with respect to the holding terminals.

When crystal blank 2 subjected to edge dressing into a bevel shape or convex shape and having a large width is secured to holding terminals 3, the inclined surface of crystal blank 2 contacts the mutually facing edges of the pair of holding terminals 3 as shown in FIG. 4. Here, since holding terminals 3 are also used to fix crystal blank 2 of a small width, distance W1 between holding terminals 3 is short. Therefore, the position where crystal blank 2 contacts holding terminals 3 is a position near the center of crystal blank 2 and the end in the width direction of crystal blank 2 is located above and apart from the surface of holding terminals 3 as indicated by separation distance d1.

In contrast to this, conductive adhesive 7 fixes crystal blank 2 to holding terminals 3 at positions corresponding to both ends in the width direction of crystal blank 2 to avoid influences on the characteristic of crystal blank 2 in the vibration region. Even when conductive adhesive 7 is applied to holding terminals 3 so as to correspond to both ends in the width direction of crystal blank 2, crystal blank 2 is placed on conductive adhesive 7 and crystal blank 2 is pressed, the surface of crystal blank 2 contacts the edges of holding terminals 3, and therefore no pressing force is transmitted to conductive adhesive 7. Therefore, the thickness of conductive adhesive 7 for fixing crystal blank 2 to holding terminals 3 increases especially in the portion contacting the periphery of the crystal blank, conductive adhesive 7 applied to holding terminals 3 does not spread, and the area of contact between holding terminals 3 and conductive adhesive 7 and the area of contact between conductive adhesive 7 and crystal blank 2 become small. The fixing strength of crystal blank 2 by conductive adhesive 7 with respect to holding terminals 3 decreases. In this case, even the amount of conductive adhesive 7 is increased to expand the contact area, the thickness of conductive adhesive 7 does not decrease, and therefore the fixing strength against shocks does not substantially improve. Further increasing the amount of conductive adhesive 7 causes conductive adhesive 7 to adhere even to the position near the center of crystal blank 2, deteriorating the vibration characteristic of crystal blank 2, producing variations in the spread of conductive adhesive 7, thus making the vibration characteristic non-uniform.

After all, when crystal blank 2 having an inclined surface through edge dressing is fixed to holding terminals 3 of container body 1, which is standardized for various types of crystal blank 2 having different planar outside shapes, the anti-shock characteristic deteriorates.

SUMMARY OF THE INVENTION

It is an object of the present invention to provide a quartz crystal device for surface mounting having a good anti-shock characteristic and capable of satisfactorily maintaining a vibration characteristic even when a shock is applied.

According to a first aspect of the present invention, a quartz crystal device includes: a container body having a recess; a pair of holding terminals formed on an inner bottom surface of the recess of the container body; and a crystal blank, both principal surfaces of which are provided with excitation electrodes with lead-out electrodes extending from the pair of excitation electrodes toward both sides of one end of the crystal blank, wherein both sides of one end of the crystal blank are fixed to the holding terminals using a conductive adhesive, pillow members are provided on the inner bottom surface of the recess of the container body at positions corresponding to corners on both sides of the other end of the crystal blank and the two pillow members are independent of each other.

In such a configuration, when a free end of the crystal blank including the excitation electrode swings due to a shock, both sides of the excitation electrode in the width direction contact the pillow members. Even when the contact due to the shock causes damage to the excitation electrode, the position of the damage is the position on each of both sides in the width direction of the free end of the crystal blank, and this position is farthest from the center of vibration of the crystal blank. Therefore, the influence on the vibration characteristic is minimal. As a result, the variation of an equivalent circuit constant of the crystal blank due to, for example, the damage to the excitation electrode is also small and the vibration characteristic is maintained satisfactorily.

According to a second aspect of the present invention, a quartz crystal device include: a container body having a recess; a pair of holding terminals formed on an inner bottom surface of the recess of the container body; and a crystal blank, both principal surfaces of which are provided with excitation electrodes with lead-out electrodes extending from the pair of excitation electrodes toward both sides of one end of the crystal blank, wherein both sides of one end of the crystal blank are fixed to the holding terminals using a conductive adhesive, and the each holding terminal comprises a first region formed near the facing holding terminal and a second region having a greater thickness than the first region formed far from the facing holding terminal.

In such a configuration, when the width of the crystal blank is small, the crystal blank can be fixed to the holding terminals in a region near the center of the holding terminals, that is, the first region having a small thickness. On the other hand, when the width of the crystal blank is large, the crystal blank can be fixed to the holding terminals in a region near outside the holding terminal, that is, the second region having a large thickness. Therefore, various types of crystal blank having different widths can be accommodated in the container body having a standardized size in the same way as in the related arts and productivity can be improved. When the crystal blank having a swelled central part through edge dressing is fixed, the region of a large thickness of the crystal blank enters the recessed part formed by a difference in level between the first region and the second region and it is thereby possible to reduce the separation distance between the lead-out electrode on the crystal blank and the top surface of the holding terminal in the region where the conductive adhesive is placed. The thickness of the conductive adhesive reduces and the contact area increases, and therefore the fixing strength between the crystal blank and holding terminals improves and the anti-shock characteristic can be maintained satisfactorily.

DETAILED DESCRIPTION OF THE PREFERRED EMBODIMENTS

Figure 1A:
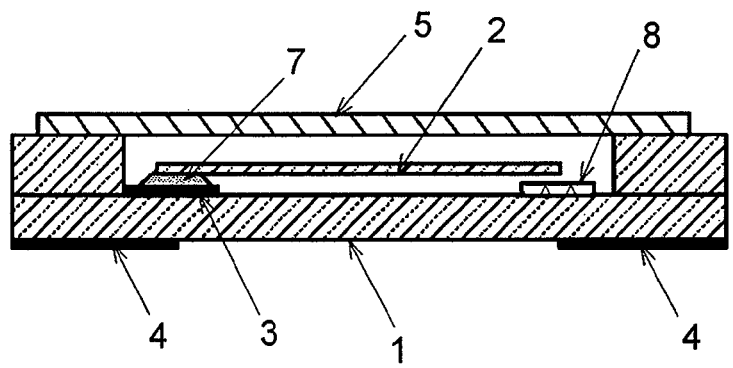
FIG. 1A is a cross-sectional view showing an example of configuration of a conventional surface-mount crystal unit.
Figure 1B:
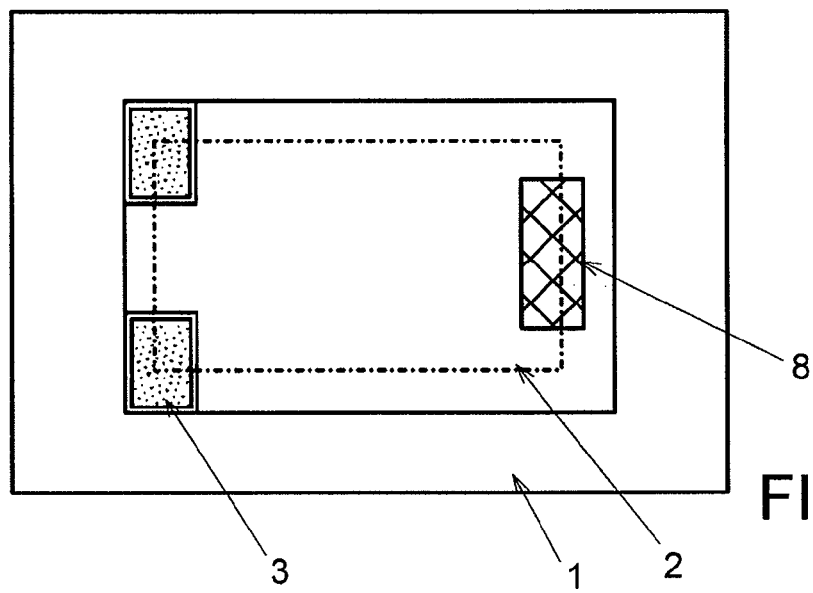
FIG. 1B is a plan view of the conventional surface-mount crystal unit with the cover removed.
Figure 2:
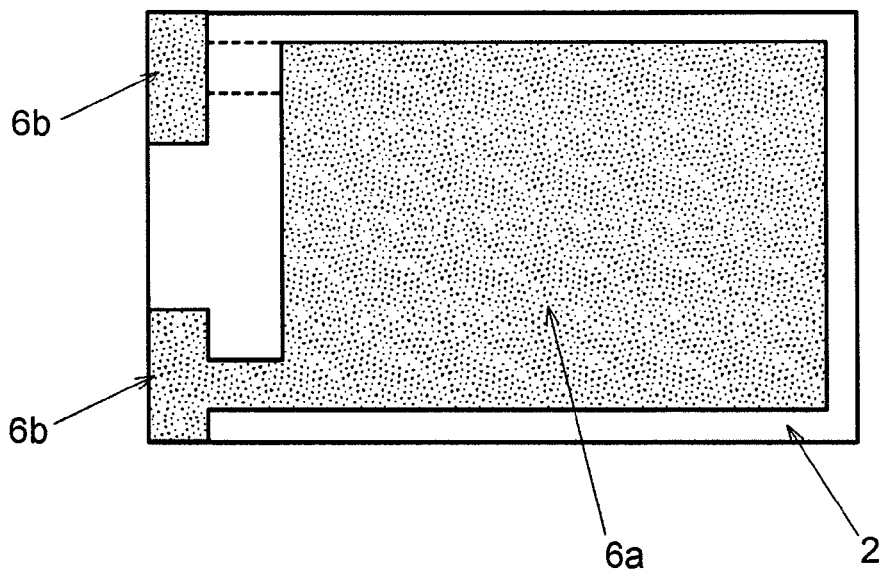
FIG. 2 is a plan view showing a crystal blank.
Figure 5:
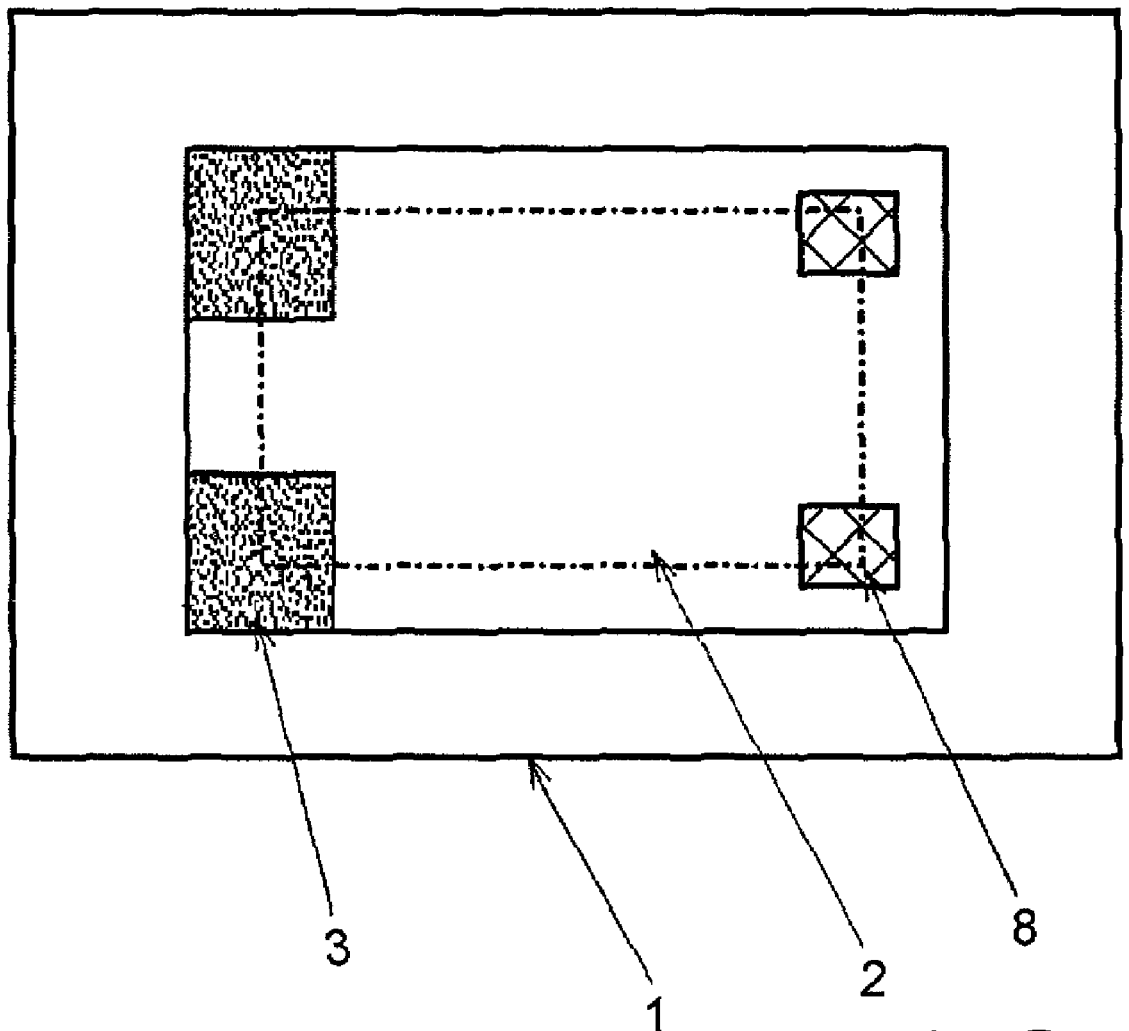
FIG. 5 is a plan view of a surface-mount crystal unit according to a first embodiment of the present invention with a metal cover removed.

In FIG. 5 showing a surface-mount crystal unit, which is a quartz crystal device according to a first embodiment of the present invention, the same components as those in aforementioned FIGS. 1A, 1B and 2 are assigned the same reference numerals and redundant explanations will be simplified or omitted.

The crystal unit shown in FIG. 5 is similar to those shown in FIGS. 1A, 1B and 2, but different from those in FIGS. 1A, 1B and 2 in the number and arrangement of pillow members 8. FIG. 5 shows the crystal unit with a metal cover removed for explanation.

This crystal unit is obtained by fixing both sides of one end of crystal blank 2, to which lead-out electrodes 6b extend outward from excitation electrode 6a, to holding terminals 3 provided on an inner bottom surface of a recess of container body 1 by means of conductive adhesive 7 and accommodating crystal blank 2 in the recess. A free end of crystal blank 2 contacts pillow members 8 provided on the inner bottom surface of the recess, or is located above pillow members 8. The opening of the recess of container body 1 is sealed by metal cover 5 (see FIG. 1) and outside terminals 4 (see FIG. 1) are provided in four corners of the outer bottom surface of container body 1.

In this crystal unit, suppose the number of pillow members 8 provided on the inner bottom surface of container body 1 is two. These pillow members 8 are provided independently of each other for both ends in the width direction of crystal blank 2 at positions on the free end side of crystal blank 2. Pillow members 8 are formed of ceramic coats by, for example, printing and burning. In this example, the thicknesses of holding terminals 3 and pillow members 8 are greater than those shown in FIGS. 1A and 1B.

As crystal blank 2, one similar to that shown in FIG. 2 is used. That is, the planar outside dimension of the crystal blank is, for example, 2.1×1.45 mm as described above, the size of excitation electrode 6a is 1.6×1.2 mm and the area ratio of excitation electrode 6a to crystal blank 2 is approximately 63%.

With such a configuration, when a shock is applied and the free end of crystal blank 2 swings up and down, only both ends in the width direction of excitation electrode 6a on the principal surface of crystal blank 2 facing pillow members 8 contact pillow members 8. Therefore, damage in excitation electrode 6a due to contact with pillow members 8 occurs at a position farthest from the center of vibration, that is, the center of the excitation electrode. This minimizes the influence of the contact between excitation electrode 6a and pillow members 8 on the vibration characteristic. The variation in an equivalent circuit constant of the crystal unit also decreases, frequency variations are suppressed and the vibration characteristic is maintained satisfactorily. In this case, since the size of excitation electrode 6a can be maintained in the same way as in the related arts, the crystal impedance (CI) can be kept to a small value.

Figure 6A:
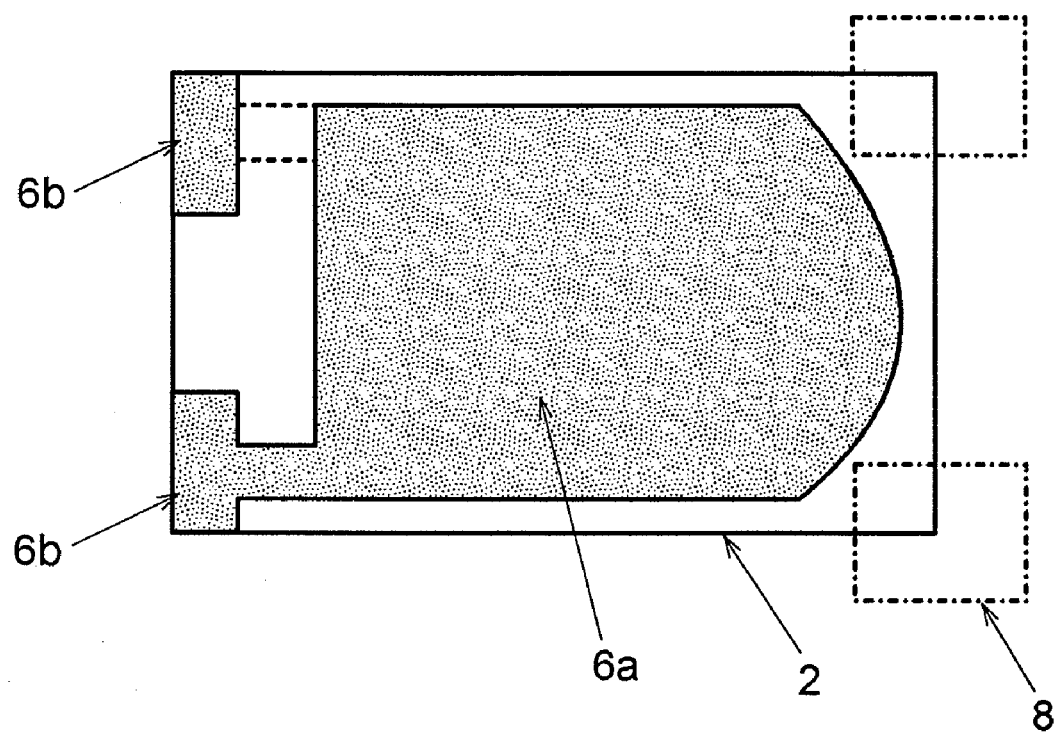
FIGS. 6A and 6B are plan views showing other examples of a relationship between the crystal blank and the pillow members in the first embodiment.

In the example shown in FIG. 5, the shape of excitation electrode 6a in crystal blank 2 is a rectangle shape having four right-angled corners as shown in FIG. 2, but the shape of the excitation electrode is not limited to this. For example, as shown in FIG. 6A, both corners of excitation electrode 6a corresponding to the position of the free end of crystal blank 2 may be retracted and made into an arc shape. As a result, electrode-free portions are formed in both corners on the free end of crystal blank 2 and these electrode-free portions are opposed to respective pillow members 8. The tip of excitation electrode 6a protrudes through a region interposed between two pillow members 8.

In this configuration, even when a shock is applied and the crystal blank swings, pillow members 8 only contact the electrode-free portions of crystal blank 2, and can thereby prevent damage to excitation electrode 6a. Since the tip of excitation electrode 6a protrudes through the region interposed between two pillow members 8, the area of excitation electrode 6a can be kept large. Therefore, even if a shock is applied, this configuration allows the vibration characteristic of crystal blank 2 to be maintained satisfactorily.

Figure 6B:
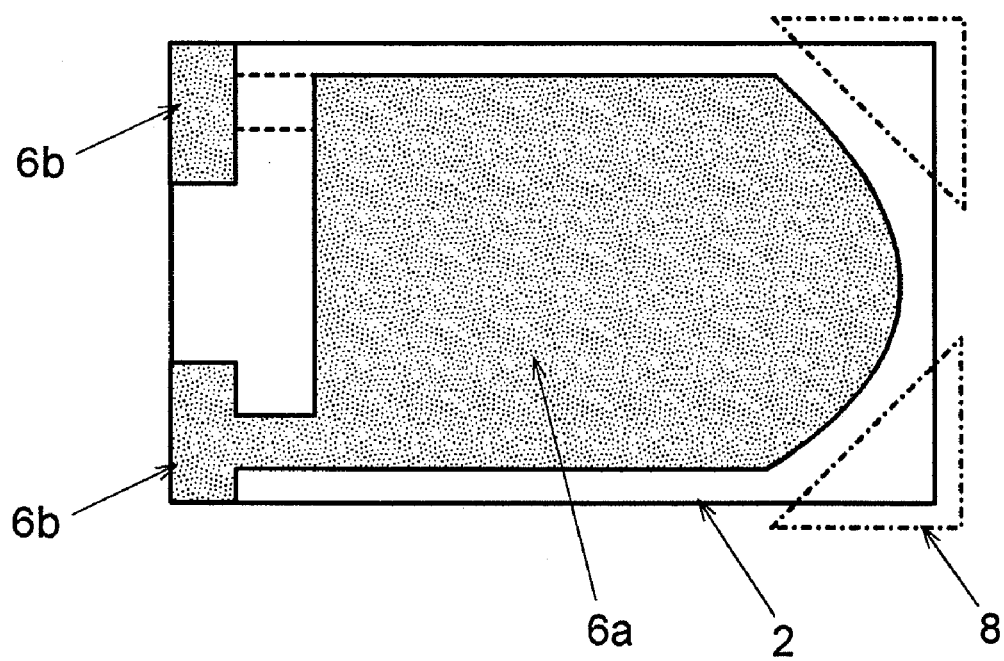

Furthermore, the shape of pillow members 8 can also be shaped like a triangular prism as shown in FIG. 6B. In this case, the planar shape of pillow members 8 is a right-angled triangle and the hypotenuse is substantially parallel to the perimeter of excitation electrode 6a after removing the corners of excitation electrode 6a. In this configuration, it is possible to increase the area of contact between crystal blank 2 and pillow members 8 when a shock is applied and realize further miniaturization of crystal blank 2.

In the examples shown in FIGS. 6A and 6B, the corners of the excitation electrode are retracted and made into an arc shape, but the corners of the excitation electrode may also be cut into a linear shape. It is essential only that the tip of excitation electrode 6a protrudes toward the region between two pillow members 8 without contacting pillow members 8.

Figure 7:
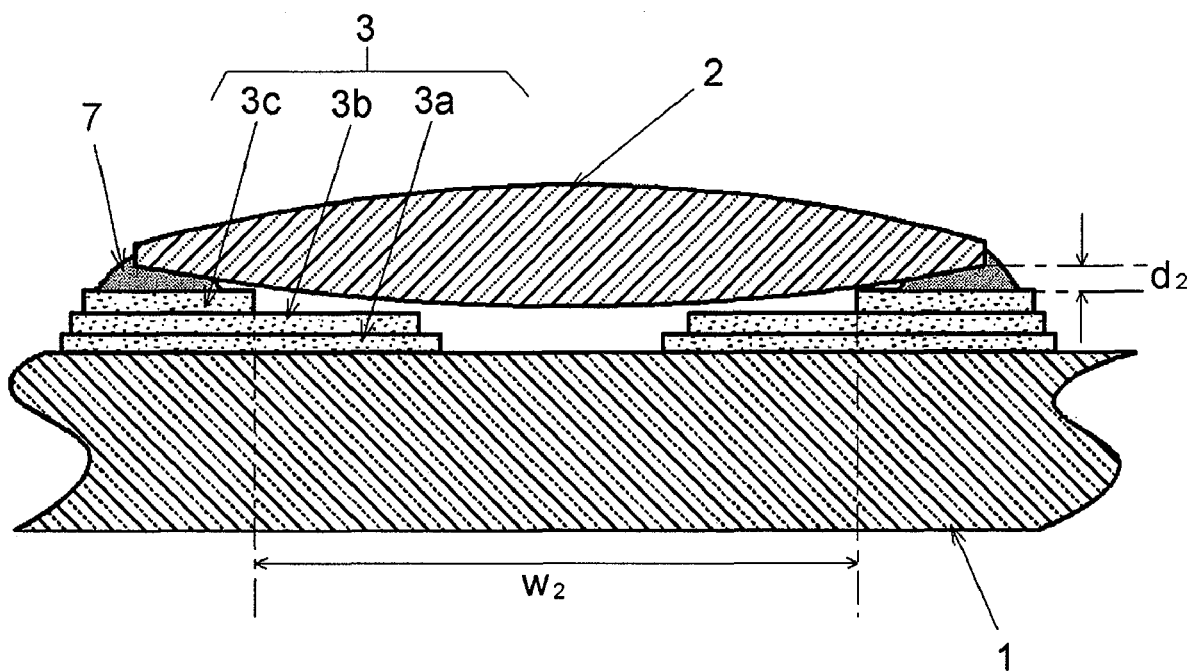
FIG. 7 is a partially enlarged cross-sectional view of a surface-mount crystal unit according to a second embodiment of the present invention.

FIG. 7 shows holding terminals 3 used for the surface-mount crystal unit which is the quartz crystal device according to the second embodiment of the present invention. In FIG. 7, the same components as those in FIGS. 1A, 1B, 2 and 4 above are assigned the same reference numerals and redundant explanations will be simplified or omitted.

This crystal unit is similar to the aforementioned one, but is different in the shape of holding terminals 3 that hold crystal blank 2.

Figure 3A:
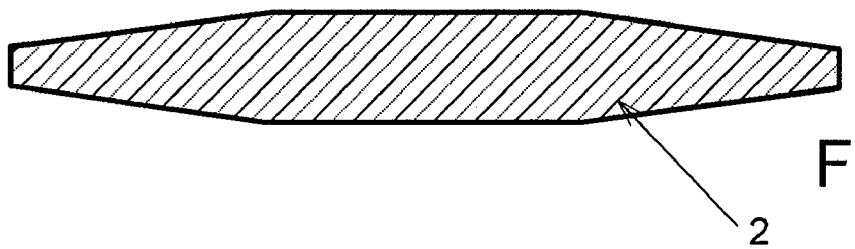
FIG. 3A is a cross-sectional view of a bevel-shaped crystal blank.
Figure 3B:
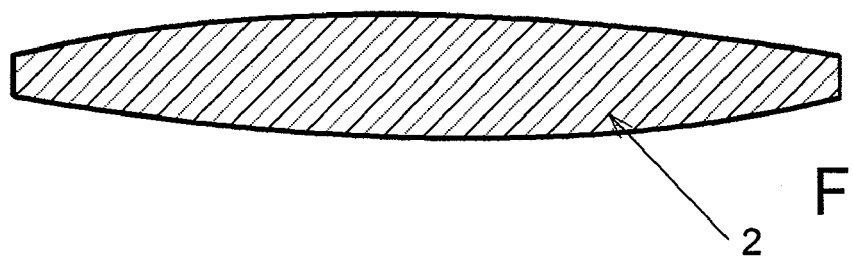
FIG. 3B is a cross-sectional view of a convex-shaped crystal blank.
Figure 3C:
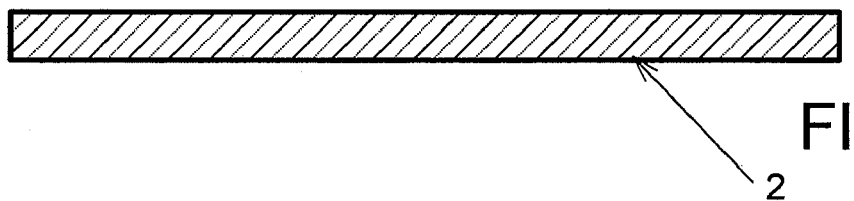
FIG. 3C is a cross-sectional view of a flat-shaped crystal blank.
Figure 4:
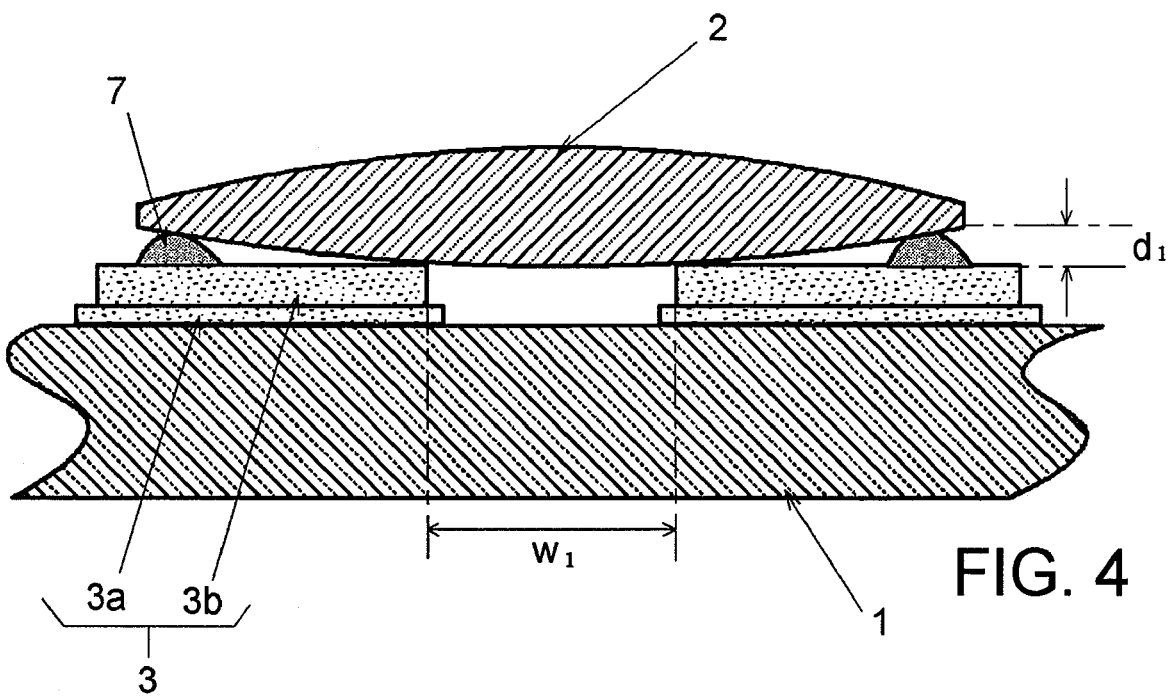
FIG. 4 is a partially enlarged cross-sectional view of the conventional surface-mount crystal unit.

As described above, this crystal unit is obtained by fixing both sides of one end of crystal blank 2, to which lead-out electrodes 6b extend outward from excitation electrodes 6a, to holding terminals 3 provided on the inner bottom surface of container body 1 having outside terminals 4 by means of conductive adhesive 7 and providing coverage and hermetic sealing with metal cover 5. As crystal blank 2, as shown in FIGS. 3A, 3B and 3C, one made into a bevel shape or convex shape through edge dressing and formed into a convex shape in both the longitudinal direction and width direction for low frequency use, or one formed into a flat shape for high frequency use is used.

In the crystal unit of the second embodiment, the pair of holding terminals provided on both sides of the one end of the inner bottom surface of container body 1 are made up of a region having a small thickness and a region having a large thickness. Here, when the layers making up holding terminals 3 are assumed to be, for example, first layer 3a, second layer 3b and third layer 3c in order from the inner bottom surface of container body 1, respective layers 3a to 3c are flat shaped and holding terminals 3 are formed to have a three-layer structure. All these layers 3a to 3c are tungsten or molybdenum layers as described above and provided using a printing method. First layer 3a also functions as a circuit pattern that realizes electrical connections with outside terminals 4. Second layer 3b is provided on first layer 3a using a printing method.

Third layer 3c is provided on second layer 3b in an approximately half region ranging from the center to the perimeter side of second layer 3b and this produces a difference in level between third layer 3c and second layer 3b. Between the pair of holding terminals 3, distance W2 between third layers 3c is larger than distance W1 shown in FIG. 4. Suppose the thicknesses of respective layers 3a to 3c are all 10 μm.

In this crystal unit, when crystal blank 2 having a small width, that is, a high vibration frequency and worked into a flat shape is fixed to holding terminals 3, conductive adhesive 7 is applied to the exposed plane of second layer 3b and both sides of one end of crystal blank 2 are fixed to second layer 3b. On the other hand, when crystal blank 2 having a large width, that is, having a low vibration frequency and a swelled central part through edge dressing is fixed to holding terminals 3, conductive adhesive 7 is applied to third layer 3c and both sides of one end of crystal blank 2 are fixed to third layer 3c. In this way, this crystal unit also allows same container body 1 to be shared for various types of crystal blank 2 having different widths. Furthermore, since both the exposed plane of second layer 3b and the top surface of third layer 3c are flat, both sides of one end of crystal blank 2, to which lead-out electrodes 6b extend outwards, can be tightly fixed to holding terminals 3 using conductive adhesive 7 irrespective of whether the width of the crystal blank is large or small.

This crystal unit provides a difference in level between second layer 3b and third layer 3c and increases distance W2 between third layers 3c between both holding terminals 3. Therefore, when crystal blank 2 shaped through edge dressing to have a swelled central part is fixed to holding terminals 3, the central region having a large thickness of crystal blank 2 is accommodated inside the recessed part caused by a difference in level between second layer 3b and third layer 3c. The inclined surface near the perimeter of crystal blank 2 contacts edges of the inner perimeter side of third layer 3c.

Therefore, in crystal blank 2, the distance from the point of contact with the edge of third layer 3c to the perimeter end is short and separation distance d2 between the perimeter end and the top surface of holding terminals 3 is smaller than that of the related arts. As in the case of the related arts, a defined amount of conductive adhesive 7 is applied at a defined position on third layer 3c in correspondence with both ends in the width direction of crystal blank 2, both sides of one end of crystal blank 2 are pressed against this conductive adhesive 7. This causes crystal blank 2 to be fixed to holding terminals 3.

According to this embodiment, since separation distance d2 between crystal blank 2 and third layer 3c is short, conductive adhesive 7 is pressed so as to become thinner and broader. Therefore, the contact area of conductive adhesive 7 also increases, making it possible to increase fixing strength on both sides of one end of crystal blank 2 with respect to holding terminals 3.

Figure 8:
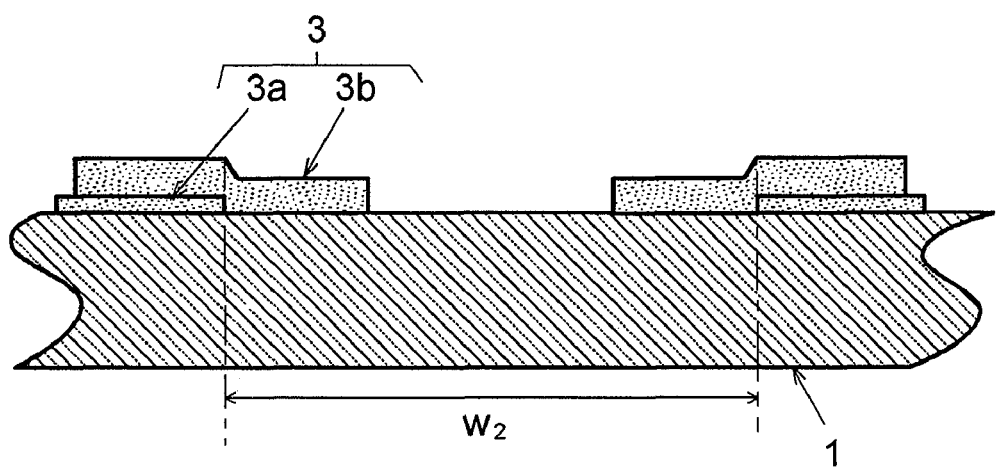
FIG. 8 is a partially enlarged cross-sectional view showing another example of the surface-mount crystal unit based on the second embodiment.

In the example explained above, a three-layer structure of first layer 3a, second layer 3b and third layer 3c is adopted and a region of small thickness and a region of large thickness are formed for holding terminals 3, but holding terminals 3 may also have a two-layer structure as shown, for example, in FIG. 8. That is, first layer 3a to be used also as a circuit pattern is formed using a printing method and second layer 3b is then formed so as to extend across the exposed part of the inner bottom surface of container body 1 and the top surface of first layer 3a. In this way, the part where second layer 3b is directly provided on the inner bottom surface is assumed to be a region having a small thickness and the part where first layer 3a and second layer 3b are stacked is assumed to be a region having a large thickness. In this case, the distance between the regions having a large thickness between the pair of holding terminals 3 is assumed to be W2, which is wider than that of the related arts. This makes it possible to obtain advantageous effects similar to those shown in FIG. 7. Since holding terminals 3 can be formed in a two-layer structure, this embodiment is advantageous from the standpoint of manufacturing. More specifically, when holding terminals 3 are formed using a printing method, the number of printing steps can be reduced.

The first and second embodiments of the present invention have been explained so far, but the quartz crystal device to which the present invention is applied is not limited to those described above. For example, the present invention is also applicable to a surface-mount crystal accommodating a crystal blank and an IC (integrated circuit) chip in which an oscillation circuit using the crystal blank is integrated in the same container as long as such a crystal oscillator has a structure for holding both sides of one end of crystal blank 2 in the container.

What is claimed is:

1. A quartz crystal device comprising:
   a container body having a recess;
   a pair of holding terminals formed on an inner bottom surface of the recess of the container body; and
   a crystal blank having a substantially rectangular shape and comprising a first principal surface, a second principal surface, a first end, a second end, a first side and a second side, the first principal surface being provided with a first excitation electrode with a first lead-out electrode extending from the first excitation electrode toward the first end at the first side of the crystal blank, and the second principal surface being provided with a second excitation electrode with a second lead-out electrode extending from the second excitation electrode toward the first end at the second side of the crystal blank;
   wherein the first and second sides of the first end of the crystal blank are fixed to the holding terminals using a conductive adhesive such that the crystal blank is held in the recess so as not to contact with pillow members unless a mechanical shock is applied, said pillow members being provided on an inner bottom surface of the recess of the container body at positions corresponding to corners of the first and second sides of the second end of the crystal blank, the two pillow members being independent of each other,
   wherein each of the excitation electrodes has a shape with portions corresponding to a corner at each of the first and second sides at the second end removed and a tip of the excitation electrode protrudes through a region between the two pillow members.

2. The quartz crystal device according to claim 1, configured as a crystal unit.

3. The quartz crystal device according to claim 1, wherein each of the principal planar surfaces of the crystal blank is flat.

4. The quartz crystal device according to claim 1, wherein each of the principal planar surfaces of the crystal blank is beveled or convex.

5. A quartz crystal device comprising:
a container body having a recess;
a pair of holding terminals formed on an inner bottom surface of the recess of the container body said holding terminals are made of metallic layers; and
a crystal blank, wherein two principal surfaces on the crystal blank are provided with a pair of excitation electrodes with lead-out electrodes extending from the pair of excitation electrodes toward two sides of one end of the crystal blank,
wherein the two sides of the one end of the crystal blank are fixed to the holding terminals using a conductive adhesive, and
each holding terminal comprises a first region formed adjacent the other holding terminal and a second region, which is thicker than the first region, formed away from the other holding terminal.

6. The quartz crystal device according to claim 5, wherein both the first region and the second region have flat surfaces.

7. The quartz crystal device according to claim 5, wherein the each holding terminal comprises a first layer, a second layer and a third layer formed in order on the inner bottom surface of the recess of the container body, the first layer also functions as a circuit pattern that becomes a wiring path, a difference in level is provided between the second layer and the third layer and an exposed region of the second layer is assumed to be the first region and a region in which the third layer is formed is assumed to be the second region.

8. The quartz crystal device according to claim 7, wherein a length of the first region in a direction along which the pair of holding terminals are arranged is equal to a length of the second region in the direction.

9. The quartz crystal device according to claim 5, wherein the each holding terminal comprises a first layer and a second layer formed in order on the inner bottom surface of the recess of the container body, the first layer also functions as a circuit pattern that becomes a wiring path, the second layer is formed so as to extend across the inner bottom surface and the top surface of the first layer, and a region in which the second layer is directly formed on the inner bottom surface is assumed to be the first region and a region in which the first layer and the second layer are stacked is assumed to be the second region.

10. The quartz crystal device according to claim 9, wherein a length of the first region in a direction along which the pair of holding terminals are arranged is equal to a length of the second region in the direction.

11. The quartz crystal device according to claim 5, configured as a crystal unit.

12. The quartz crystal device according to claim 5, wherein a length of the first region in a direction along which the pair of holding terminals are arranged is equal to a length of the second region in the direction.

13. The quartz crystal device according to claim 5, wherein each of the principal planar surfaces of the crystal blank is flat.

14. The quartz crystal device according to claim 5, wherein each of the principal planar surfaces of the crystal blank is beveled or convex.

* * * * *

UNITED STATES PATENT AND TRADEMARK OFFICE
CERTIFICATE OF CORRECTION

| | |
|---|---|
| PATENT NO. | : 7,915,791 B2 |
| APPLICATION NO. | : 12/252171 |
| DATED | : March 29, 2011 |
| INVENTOR(S) | : Katsunori Akane and Masakazu Harada |

It is certified that error appears in the above-identified patent and that said Letters Patent is hereby corrected as shown below:

Title page Item [56]
At column 2, line 12, on page 2, please delete "Jun. 6, 2010" and insert --Jun. 16, 2010--, therefor.

Signed and Sealed this
Twentieth Day of December, 2011

David J. Kappos
*Director of the United States Patent and Trademark Office*